United States Patent [19]
Sakaguchi et al.

[11] Patent Number: 5,431,741
[45] Date of Patent: Jul. 11, 1995

[54] SILICON SOLAR CELL

[75] Inventors: Susumu Sakaguchi; Toru Yamada; Tadashi Kamioka; Teruhiko Hirasawa, all of Kanagawa, Japan

[73] Assignee: Shin-Etsu Chemical Co., Ltd., Tokyo, Japan

[21] Appl. No.: 166,384

[22] Filed: Dec. 13, 1993

[30] Foreign Application Priority Data

Dec. 11, 1992 [JP] Japan .................. 4-353247
Jul. 26, 1993 [JP] Japan .................. 5-183858

[51] Int. Cl.⁶ .................... H01L 31/042; H01L 31/05
[52] U.S. Cl. .................... 136/244; 136/255; 136/256
[58] Field of Search .................... 136/244, 255, 256

[56] References Cited

U.S. PATENT DOCUMENTS 3,046,324  7/1962  Matlow .................. 136/256
3,984,256  6/1975  Fletcher et al. .
4,454,372  6/1984  Appleby .................. 136/250

FOREIGN PATENT DOCUMENTS 2327643  10/1975  France .................. 136/246
84-04425  4/1984  WIPO .................. 136/244

Primary Examiner—Aaron Weisstuch
Attorney, Agent, or Firm—McAulay Fisher Nissen Goldberg & Kiel

[57] ABSTRACT

A novel structure of a silicon solar cell is disclosed, which can be prepared at an outstandingly low cost but can still exhibit good efficiency for the conversion of solar energy to electricity. The silicon solar cell comprises, as an integral body:

(a) an electrically insulating substrate plate of, e.g., glass or a ceramic;

(b1) a first group of metal contact lines formed in parallel with each other on the substrate surface to jointly serve as an electrode; (b2) a second group of metal contact lines formed in parallel with each other on the substrate surface to jointly serve as a counterelectrode, each of the metal contact lines of the second group being disposed between two metal contact lines of the first group, maintaining electric insulation therebetween; and (c) a plural number of wires of silicon semiconductor, each of which perpendicularly crosses each of the metal contact lines of the first and second groups in direct contact therewith. When the silicon semiconductor is of the n-type, for example, and has discrete p-type regions which are in contact with the metal contact lines of one of the groups, photovoltaic power is generated between the electrodes under irradiation with sunlight. An alternative arrangement of the silicon semiconductor wires is also proposed in which each of the silicon wires bridges a metal contact line of the first group and a metal contact line of the second group in lengthwise contact therewith.

19 Claims, 2 Drawing Sheets

SILICON SOLAR CELL

BACKGROUND OF THE INVENTION

The present invention relates to a solar cell of silicon semiconductor. More particularly, the invention relates to a silicon solar cell having a novel and unique structure which is capable of exhibiting high efficiency for the conversion of the solar energy into electric energy despite the outstandingly low costs for the preparation thereof.

It should be mentioned that, while the energy traditionally consumed by mankind is obtained almost exclusively from fossil fuels such as coal, petroleum and natural gas, these carbon-based energy sources are at the risk of exhaustion in the near future and, in addition, responsible for the problems of environmental pollution such as the problem of global warming as recognized as a serious issue in recent years. Under the above mentioned background situation, it is eagerly desired to develop a means for the direct conversion of solar energy to electric energy so that solar cells utilizing a silicon semiconductor are highlighted as a promising means for the solar power generation. Despite the large accumulation of results obtained by the research and development efforts undertaken heretofore in countries world-wide, the largest factor which prohibits the practical utilization of silicon solar cells is the high cost of the electric power generated by using them as compared with conventional means for commercial power generation so that the efforts for the development of solar cells are directed to the cost reduction in the manufacture of silicon solar cells.

A conventional silicon solar cell typically has a structure in which a p-type silicon semiconductor, which may be single crystalline, polycrystalline or amorphous, is subjected to a diffusion treatment on one surface with an n-type dopant to form a pn-junction and electrodes are provided, one in contact with the p-type region and the other in contact with the n-type diffusion layer. When the cell is irradiated on the surface of the retype diffusion layer with light such as sunlight, photovoltaic power is generated between the electrode in contact with the p-type region as the positive electrode and the electrode in contact with the n-type diffusion layer as the negative electrode.

A problem in the silicon solar cell of the above described structure is the high manufacturing cost of the silicon semiconductor substrate, especially due to the material loss in the process of slicing of a single crystalline or polycrystalline rod of silicon and lapping of the sliced wafers. In a silicon solar cell using amorphous silicon semiconductor in the form of a thin film, the cost for the material per se is very small but such silicon solar cells are still not practical for energy conversion because of the high investment costs for the manufacturing facilities and also of the degradation in the conversion efficiency of the cell with time as a result of an increase in the density of defects in the solar cells.

SUMMARY OF THE INVENTION

The present invention accordingly has an object to provide a silicon solar cell of a novel and unique structure capable of being manufactured at low manufacturing costs without decreasing the energy conversion efficiency from the solar energy to electricity.

Thus, the silicon solar cell in the first embodiment of the invention is an integral structure which comprises:

(a) a substrate made from an electrically insulating material;

(b1) a first group of substantially parallel spaced apart metal contact lines formed from a first electrically conductive material on the surface of the substrate in an array jointly serving as an electrode of the solar cell;

(b2) a second group of substantially parallel spaced apart metal contact lines formed from a second electrically conductive material on the surface of the substrate in an array jointly serving as the counterelectrode of the solar cell, each of the metal contact lines of the second group being disposed between two metal contact lines of the first group with electrical insulation therefrom; and (c) a plurality of wires of a silicon semiconductor of n-type or p-type conductivity disposed, preferably, perpendicularly to the metal contact lines in such a fashion that each of the wires of the silicon semiconductor is connected with each of the metal contact lines of the first and the second groups, each of the silicon semiconductor wires having discrete regions of p-type or n-type, respectively, each of which discrete regions is in contact with the metal contact lines belonging to the first or the second group.

Alternatively, the silicon solar cell in the second embodiment of the invention is an integral structure which comprises:

(a) a substrate made from an electrically insulating material;

(b1) a first group of substantially parallel spaced apart metal contact lines formed from a first electrically conductive material on the surface of the substrate in an array and jointly serving as an electrode of the solar cell;

(b2) a second group of a substantially parallel spaced apart metal contact lines formed from a second electrically conductive material on the surface of the substrate in an array jointly serving as the counterelectrode of the solar cell, each of the metal contact lines of the second group being disposed between two metal contact lines of the first group with electrical insulation therefrom; and (d) a plurality of wires of a silicon semiconductor disposed in such a fashion that each of the wires of the silicon semiconductor is in lengthwise contact with one of the metal contact lines of the first group and with one of the metal contact lines of the second group, the surface region of each of the silicon semiconductor wires connected in lengthwise contact with the metal contact lines of the first group being of p-type conductivity and the surface region of each of the silicon semiconductor wires connected in lengthwise contact with the metal contact lines of the second group being of n-type conductivity.

DETAILED DESCRIPTION OF THE PREFERRED EMBODIMENTS

As is described above, the essential elements forming the silicon solar cell according to each of the first and second embodiments include an electrically insulating substrate, metal contact lines belonging to the first and second groups serving as an electrode and counterelectrode, respectively, and wires of a silicon semiconductor, each of which is connected with the metal contact lines of the first and second groups.

In the following, the silicon solar cell according to the first embodiment is described in detail by making reference to FIGS. 1 to 4 of the accompanying drawing.

Figure 1:
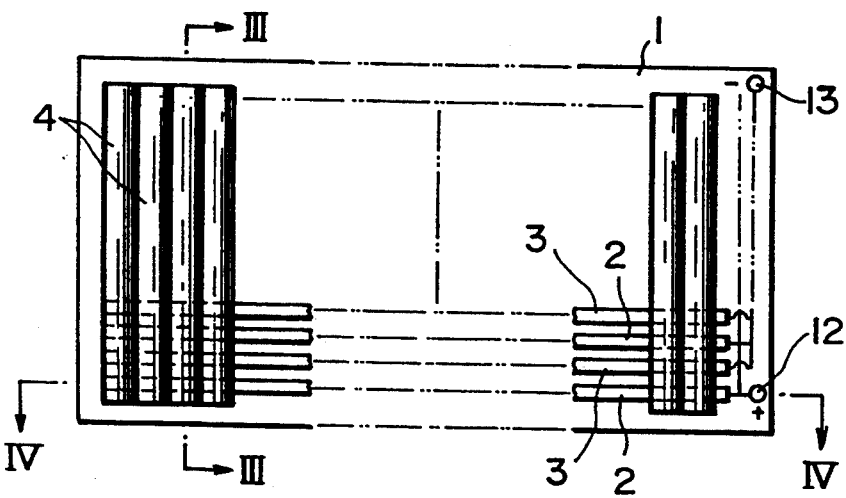
FIG. 1 is a schematic plan view of the silicon solar cell according to the first embodiment.
Figure 2:
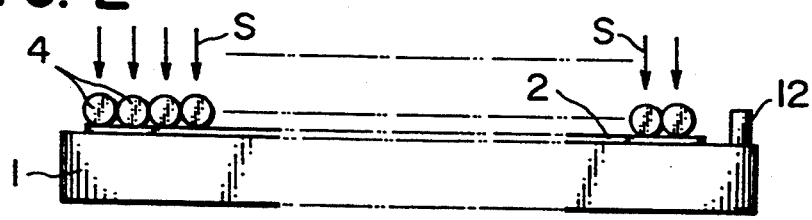
FIG. 2 is a schematic side view of the silicon solar cell illustrated in FIG. 1.
Figure 3:
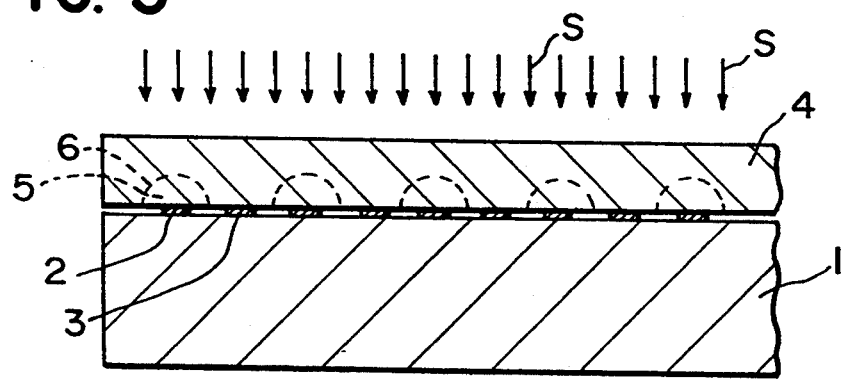
FIG. 3 is a schematic cross sectional view of the silicon solar cell illustrated in FIGS. 1 and 2 as cut along the line and as viewed in the direction of the arrows indicated by III—III in FIG. 1.
Figure 4:
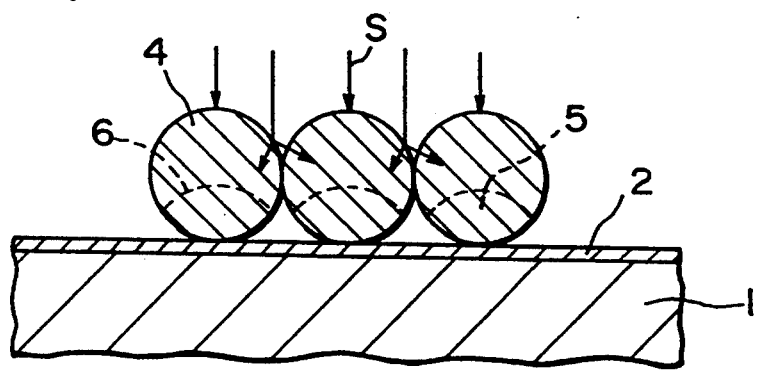
FIG. 4 is a schematic cross sectional view of the silicon solar cell illustrated in FIGS. 1 and 2 as cut along the line and as viewed in the direction of the arrows indicated by IV—IV in FIG. 1.

FIGS. 1 and 2 are a plan view and a side view, respectively, of the silicon solar cell according to the first embodiment, in which a substrate 1 made from an electrically insulating material is provided on its surface with two groups of metal contact lines each consisting of a plural number of parallel lines 2 and 3 and, further thereon, with a plural number of silicon semiconductor wires 4. The electrically insulating material forming the substrate 1 is not particularly limited and includes ceramic materials, polymeric materials and the like, although ceramic materials including oxide ceramics such as glass, fused silica glass, alumina and the like as well as non-oxide ceramics such as silicon nitride, aluminum nitride and the like are preferred in respect of the heat resistance to withstand the temperature in the heat treatment conducted in the preparation of the solar cell. The thickness of the substrate 1 is not particularly limited provided that an appropriate mechanical strength can be ensured. If necessary, a metal plate having a coating layer of the above mentioned insulating material can be used for the substrate.

The metal contact lines belonging to the first group 2 and those belonging to the second group 3 are provided in direct contact with the surface of the substrate plate 1 each in parallel with the others. It is essential that the metal contact lines of the first group 2 and the metal contact lines of the second group 3 are arranged alternately such that each of the first group metal contact lines 2 is between two of the second group metal contact lines 3 with electrical insulation therebetween and vice versa. The first group metal contact lines 2 jointly serve as an electrode, e.g., positive electrode, and are connected to an output terminal 12 while the second group metal contact lines 3 jointly serve as the counterelectrode, e.g., negative electrode and are connected to another output terminal 13. The metal contact lines 2, 3 are formed on the surface of the substrate 1 by a suitable known method such as sputtering though not particularly limited thereto. In order for the device to work as a silicon solar cell, it is essential that at least one of the above mentioned metal contact lines is made from a material containing a dopant. When the silicon semiconductor is of the n-type conductivity, for example, the metal contact lines serving as the positive electrode are made from a material containing a p-type dopant and, when the silicon semiconductor is of the p-type conductivity, the metal contact lines serving as the negative electrode are made from a material containing an n-type dopant.

The dopant for the positive electrode can be selected from the elements including aluminum, boron, gallium, and indium and the dopant for the negative electrode can be selected from phosphorus, antimony, bismuth, and arsenic. These dopant elements can be used in the form of a metal or alloy or in the form of a compound containing the same. For example, the dopant element is used in the form of an alloy with silicon, silver, gold, palladium, platinum, copper, nickel, titanium, molybdenum, tungsten and the like or in the form of a compound such as oxides, nitrides, carbides, oxynitrides and the like.

As is mentioned above, a plural number of wires 4 of a silicon semiconductor are provided on the arrays of the first and second group metal contact lines 2, 3. FIG. 1 illustrates disposition of the silicon semiconductor wires 4, each of which is disposed substantially perpendicularly to the arrays of the metal contact lines 2, 3 although the angle formed between the silicon semiconductor wires 4 and the metal contact lines 2, 3 is not limited to a right angle.

In a typical example of the silicon solar cell according to the first embodiment illustrated in FIGS. 1 to 4, the metal contact lines 2 of the first group are formed from an alloy of silver and aluminum while the metal contact lines 3 of the second group are formed from pure silver. The n-type silicon semiconductor wires 4 are provided in contact with each of the metal contact lines of the first and second groups 2, 3, perpendicularly thereto. The thus formed assembly is then subjected to a heat treatment in a furnace so that diffusion of aluminum as a p-type dopant takes place from the metal contact lines 2 of the first group into the n-type silicon semiconductor wires 4 to form discrete p-type regions 5 with a pn-junction 6 in the semiconductor wires 4 (see FIGS. 3 and 4). The metal contact lines of the first group 2 are jointly connected to an output terminal 12 serving as a positive electrode while the metal contact lines of the second group 3 are jointly connected to another output terminal 13 serving as a negative electrode. It is optional to provide the inventive silicon solar cell with a low-reflectance coating layer thereon and further with a protective coating layer of a polymeric resin or a glass plate. When the thus constructed silicon solar cell is irradiated with sunlight S through the protective coating layer, photovoltaic power is generated between the output terminals 12, 13.

The cross-sectional profile of the silicon semiconductor wires 4 is not particularly limited and can be circular, polygonal or any other form although a circular cross-section is preferred. The cross-sectional area of each of the silicon semiconductor wires 4 is preferably in the range from 200 $\mu m^2$ to 1 $mm^2$.

The combination of the first and second metallic materials forming the metal contact lines 2, 3 of the first and second groups, respectively, depends on the conductivity type of the silicon semiconductor wires 4. When the silicon semiconductor is of the n-type conductivity, a combination of the first and second metallic materials is a metal such as silver, gold, and platinum or an alloy thereof containing a compound of one of boron, aluminum, gallium, and indium as a dopant for silicon semiconductors for the metal contact lines 2 of the first group serving as the positive electrode and silver, gold, platinum or an alloy thereof containing or not containing an n-type dopant for the metal contact lines 3 of the second group serving as the negative electrode so that discrete p-type regions are formed in the n-type silicon semiconductor wires 4 in the portions in contact with the metal contact lines 2 of the first group made from, e.g., an alloy of aluminum and silver. When the silicon semiconductor is of the p-type, on the other hand, the metal contact lines 2 serving as the positive electrode are formed preferably from silver, gold, platinum or an alloy thereof containing or not containing a p-type dopant and the metal contact lines 3 serving as the negative electrode are formed preferably from an alloy containing at least one of antimony, phosphorus, arsenic, and bismuth as an n-type dopant so that the discrete n-type regions are formed in the p-type silicon semiconductor wires 4 in the portions in contact with the metal contact lines 3 of the second group made from an antimony-, phosphorus-, arsenic-, or bismuth-containing alloy.

The metal contact lines 2, 3 can be formed on the surface of the insulating substrate 1 by a thin film-forming method selected from the methods of vacuum vapor deposition, sputtering, ion plating, priming and the like, followed by a patterning method such as the photolithographic patterning method. A method of printing, e.g., screen priming, is of course applicable by using a paste containing fine particles of a conductive material used for the electric contact such as silver. When the metal contact lines of the two groups 2, 3 are formed by priming with, for example, a silver paste, it is convenient that the silver paste for the metal contact lines of one of the groups is admixed with phosphorus pentoxide as a phosphorus dopant so as to cause diffusion of phosphorus as an n-type dopant into the p-type silicon semiconductor wires to form a pn-junction.

Figure 5:
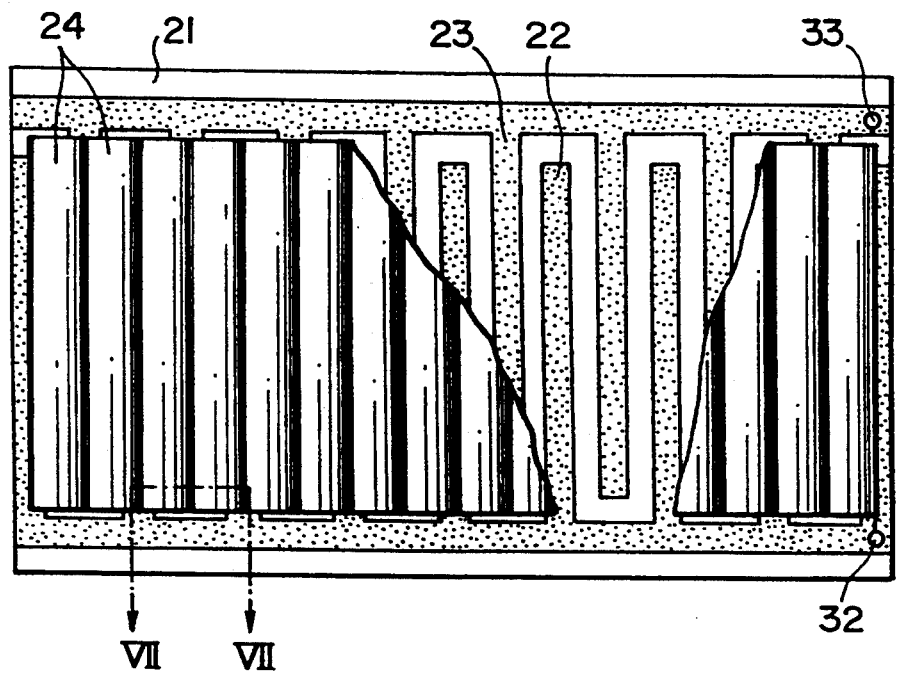
FIG. 5 is a schematic plan view of the silicon solar cell according to the second embodiment.
Figure 6:
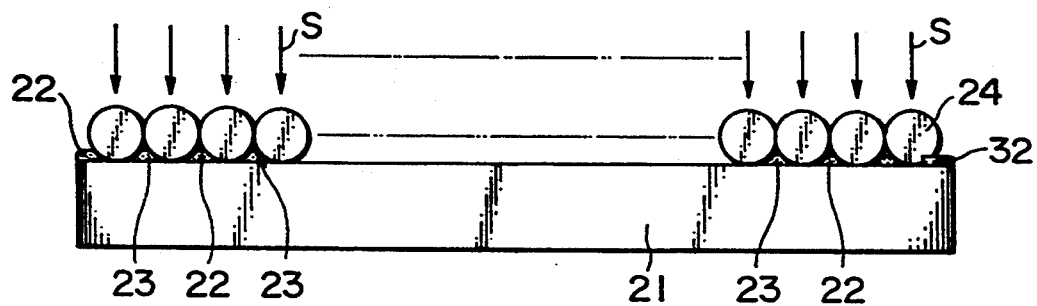
FIG. 6 is a schematic side view of the silicon solar cell illustrated in FIG. 5.
Figure 7:
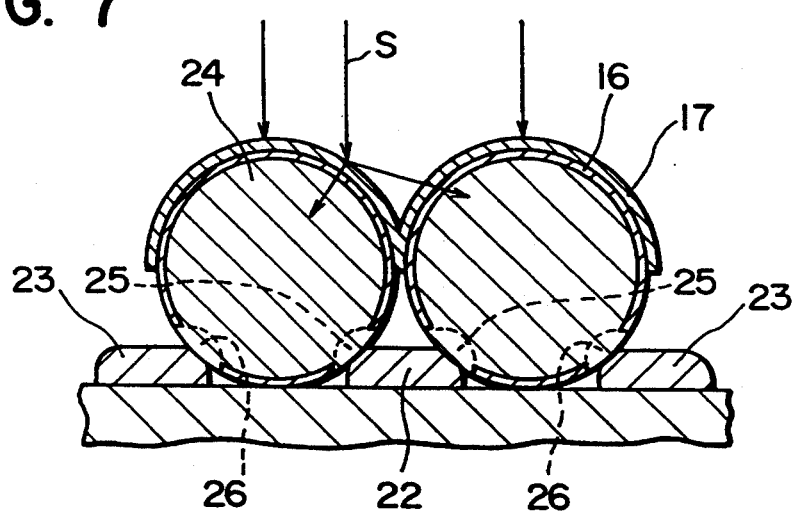
FIG. 7 is an enlarged partial cross sectional view of the silicon solar cell illustrated in FIGS. 5 and 6 as cut along the line and as viewed in the direction indicated by VII—VII in FIG. 5.

The silicon solar cell of the invention according to the second embodiment is described in detail by making reference to FIGS. 5 to 7 of the accompanying drawing. The metal contact lines 22, 23 of the first and second groups are provided alternately on the surface of an insulating substrate 21 in just the same fashion of parallelism as in the first embodiment and the metal contact lines 22 of the first group are jointly connected to an output terminal 32 to serve as an electrode while the metal contact lines 23 of the second group are jointly connected to the other output terminal 33 to serve as a counterelectrode. Different from the silicon semiconductor wires 4 in the first embodiment, the silicon semiconductor wires 24 in the second embodiment are mounted on the arrays of the metal contact lines 22, 23 of the first and second groups in such a fashion that each of the silicon semiconductor wires 24 is in lengthwise contact bridging one of the metal contact lines 22 of the first group and one of the metal contact lines 23 of the second group.

Assuming that the silicon semiconductor forming the wires 24 is of the p-type conductivity, in a typical example, the metal contact lines 22 of the first group are formed from silver containing or not containing a p-type dopant and the metal contact lines 23 of the second group are formed from silver containing an n-type dopant with electrical insulation there between and each of the silicon semiconductor wires 24 is mounted to bridge one of the metal contact lines 22 of the first group and one of the metal contact lines 23 of the second group. Thereafter, the assembly is subjected to a heat treatment in a furnace so that diffusion of the p- and n-type dopants takes place into the silicon semiconductor wires 24 to form n-type regions 26. The metal contact lines 22 are jointly connected to the output terminal 32 and the metal contact lines 23 are jointly connected to the other output terminal 33 to complete the silicon solar cell according to the second embodiment.

When the semiconductor wires 24 are of the n-type conductivity and the metal contact lines 22 are formed from silver containing a p-type dopant, diffusion of the p-type dopant takes place into the silicon semiconductor wires to form a p-type region 25 therein.

The silicon semiconductor wires 4 or 24 can be prepared by a relatively inexpensive method and need not be prepared from a single crystal rod of semiconductor silicon. For example, a silicon semiconductor wire suitable for use in the present invention can be prepared by the pulling method in which a rod of silicon semiconductor, which can be polycrystalline, held vertically and rotated around the vertical axis, is heated in the shoulder portion by means of a high-frequency induction coil to form a semispherical pool of the melt from which a fine wire of silicon is upwardly pulled up under exact control of the wire diameter. A silicon semiconductor wire can be pulled by an alternative method in which a melt of silicon is formed in a crucible and a fine wire of silicon is pulled up therefrom under exact control of the wire diameter through the orifice of a die made, for example, from silicon nitride floating on the surface of the melt. The conductivity type of the thus prepared silicon semiconductor wires can be controlled, for example, by introducing a gaseous dopant such as phosphoryl chloride as an n-type dopant or boron trichloride as a p-type dopant into the atmosphere in which these processes are performed. The volume resistivity of the semiconductor silicon wires can be controlled, preferably, in the range from 0.1 Ωcm to 100 Ωcm by appropriately selecting the concentration of these dopants in the atmosphere.

As is illustrated in FIG. 7 by an enlarged partial cross-sectional view, it is optional to provide the silicon semiconductor wires with a passivation film 16 by a surface oxidation treatment and further with a low-reflectance film 17 in order to enhance the absorption efficiency of the solar energy. It is of course desirable that the silicon solar cell of the invention as a whole is covered with a transparent protecting layer of a plastic resin or glass.

In the following, the silicon solar cell of the invention according to the first and second embodiments are illustrated in more detail by way of examples.

EXAMPLE 1

A silicon semiconductor wire having a diameter of 0.5 mm was prepared by the pulling method. An n-type polycrystalline semiconductor rod having a resistivity of 1.5 Ωcm and a diameter of 5 mm, vertically held and rotated around the vertical axis at 10 rpm, was heated in the shoulder portion by means of a surrounding high-frequency induction coil to form a pool of the melt in a semispherical form from which a wire was upwardly drawn in a length of 100 cm. This silicon semiconductor wire also had n-type conductivity and the resistivity thereof was 2 to 3 Ωcm. This 100 cm long silicon wire, was cut into 20 mm-long portions.

Separately, a 25 mm by 25 mm wide substrate plate of glass having a thickness of 1.0 mm was subjected to a sputtering treatment with silver to form a thin film of silver having a thickness of 5 μm and the silver layer was patterned by the photolithographic method into a comb-like pattern consisting of a plurality of parallel lines and a transverse line connecting the parallel lines at the respective ends thereof. The width of each of the parallel lines was 100 μm and the width of each space between two adjacent parallel lines was 300 μm. Thereafter, another sputtering treatment with aluminum was conducted without removing the photoresist layer on the silver pattern to photolithographically form a second comb-like pattern of 5 μm thick aluminum layer also consisting of a plurality of parallel lines and a transverse line connecting the parallel lines in such a fashion that each of the parallel lines of the aluminum layer was positioned alternately between two adjacent parallel lines of the silver layer while keeping equal spaces to ensure electrical insulation therebetween (see FIG. 1). The width of each of the parallel lines of aluminum was 100 μm and the width of each space between two adjacent parallel lines of aluminum was 300 μm.

In the next step, the 20 mm-long wires of silicon semiconductor prepared above were mounted and arranged on the alternate arrays of the metal contact lines of silver and aluminum in a perpendicular disposition relative to the conductive lines of silver and aluminum to form a grating of 20 mm by 20 mm matrix so that each of the silicon semiconductor wires was in direct and alternate contact with the silver and aluminum lines. The thus obtained assembly was subjected to a thermal treatment in an atmosphere of argon at 850° C. for 20 minutes to effect diffusion of aluminum into the n-type silicon semiconductor wires, thereby forming pn-junctions.

Measurement of the conversion efficiency of the solar cell gave a value of 6.8% under the conditions of AM 1.5, 28° C., and 100 mW/cm².

EXAMPLE 2

A p-type silicon semiconductor wire of 0.5 mm diameter and 100 cm length was prepared by the pulling method in the same manner as in Example 1, except for the use of a starting semiconductor silicon rod of p-type conductivity having a resistivity of 2.0 Ωm in place of the n-type one. The thus prepared silicon semiconductor wire having a resistivity of 2 to 3 Ωcm was cut into 20 mm long portions. The silicon semiconductor wires were subjected to an etching treatment to remove the surface layer of 100 μm thickness, followed by oxidation to form a passivation film of 10 nm thickness.

Separately, metal contact lines in a pattern of a combination of two comb-like patterns similar to those in Example 1 were formed on a 25 mm by 25 mm square fused quartz glass plate of 1.5 mm thickness by the method of screen printing using two electroconductive pastes of different formulations. Namely, the first conductive paste for the metal contact lines of the positive electrode was compounded from a silver powder, aluminum powder, and glass frit dispersed in a solution of a cellulosic binder in an organic solvent, while the second conductive paste for the metal contact lines of the negative electrode was compounded from a silver powder, phosphorus pentoxide powder, and glass flit dispersed in a solution of a cellulosic binder in an organic solvent. Each of the metal contact lines thus formed had a width of 200 μm and the space between two adjacent conductive lines had a width of 200 μm.

The 20 mm-long wires of silicon semiconductor were mounted each on one of the space areas between two adjacent metal contact lines so as to bridge them in lengthwise contact, thereby forming a 20 mm by 20 mm square matrix. Thereafter, the thus formed assembly was heated at 850° C. for 20 minutes in a furnace under an atmosphere of argon to effect diffusion of phosphorus and aluminum into the silicon semiconductor wires, thereby forming n+ and p+ layers, respectively, and a pn-junction. A low-reflectance film of titanium dioxide was formed on the light-receiving areas of the silicon semiconductor wires by the thermal CVD method to complete a silicon solar cell of the invention. This silicon solar cell was subjected to the measurement of the conversion efficiency in the same manner as in Example 1 and gave a value of 13.0%.

What is claimed is:

1. A silicon solar cell which is an integral structure comprising:
   (a) a substrate made from an electrically insulating material;
   (b1) a first group of a plural number of substantially parallel, spaced apart metal contact lines formed from a first electrically conductive material on the surface of the substrate in an array jointly serving as an electrode of the solar cell;
   (b2) a second group of a plural number of substantially parallel, spaced apart metal contact lines formed from a second electrically conductive material on the surface of the substrate in an array jointly serving as the counterelectrode of the solar cell, each of the metal contact lines of the second group being disposed between two metal contact lines of the first group with electrical insulation therebetween; and
   (c) a plurality of wires of a silicon semiconductor of n-type or p-type conductivity transversely disposed to the metal contact lines in such a fashion that each of the wires of the silicon semiconductor is in contact with each of the metal contact lines of the first and the second groups, each of the n-type or p-type silicon semiconductor wires having discrete regions of p-type or n-type, respectively, each of said discrete regions of p-type or n-type being in contact with the metal contact lines belonging to the first or the second group.

2. The silicon solar cell as claimed in claim 1 in which each of the wires of a silicon semiconductor intersects the metal contact lines of the first and second groups substantially perpendicularly.

3. The silicon solar cell as claimed in claim 1 in which the silicon semiconductor is of the n-type and the second electrically conductive material is a metal selected from the group consisting of silver, gold, platinum, and an alloy thereof and the first electrically conductive material is a metal selected from the group consisting of silver, gold, platinum, and an alloy thereof containing a p-type dopant for silicon semiconductors selected from the group consisting of boron, aluminum, gallium, and indium.

4. The silicon solar cell as claimed in claim 3 in which the metal contact lines of the first and second groups are formed by a method selected from vacuum vapor deposition, sputtering, ion plating and printing.

5. The silicon solar cell as claimed in claim 1 in which the silicon semiconductor is of the p-type and the first electrically conductive material is a metal selected from the group consisting of silver, gold, platinum, and an alloy thereof and the second electrically conductive material is a metal selected from the group consisting of silver, gold, platinum, and an alloy thereof containing an n-type dopant for silicon semiconductors selected from the group consisting of phosphorus, arsenic, antimony, and bismuth.

6. The silicon solar cell as claimed in claim 4 in which the metal contact lines of the first and second groups are formed by a method selected from vacuum vapor deposition, sputtering, ion plating and printing.

7. The silicon solar cell as claimed in claim 1 in which the electrically insulating material for the substrate is glass or a ceramic material.

8. The silicon solar cell as claimed in claim 1 in which each of the silicon semiconductor wires has a cross sectional area in the range from 200 $\mu m^2$ to 1 $mm^2$.

9. The silicon solar cell as claimed in claim 1 in which each of the silicon semiconductor wires has a resistivity in the range from 0.1 to 100 $\Omega cm$.

10. The silicon solar cell as claimed in claim 1 in which the silicon semiconductor is of p-type or n-type and the first electrically conductive material is a metal selected from the group consisting of silver, gold, platinum, and an alloy thereof containing a dopant element for silicon semiconductors selected from the group consisting of boron, aluminum, gallium, and indium and the second electrically conductive material is a metal selected from the group consisting of silver, gold, platinum, and an alloy thereof containing a dopant for silicon semiconductors selected from the group consisting of phosphorus, arsenic, antimony, and bismuth.

11. The silicon solar cell as claimed in claim 10 in which the metal contact lines of the first and second groups are formed by a method selected from vacuum vapor deposition, sputtering, ion plating and printing.

12. A silicon solar cell which is an integral structure comprising:

(a) a substrate made from an electrically insulating material;

(b1) a first group of a plural number of substantially parallel, spaced apart metal contact lines formed from a first electrically conductive material on the surface of the substrate in an array jointly serving as an electrode of the solar cell;

(b2) a second group of a plural number of substantially parallel, spaced apart metal contact lines formed from a second electrically conductive material on the surface of the substrate in an array jointly serving as the counterelectrode of the solar cell, each of the metal contact lines of the second group being disposed between two metal contact lines of the first group with electrical insulation therebetween; and (d) a plural number of wires of a silicon semiconductor disposed in such a fashion that each of the wires of the silicon semiconductor is in lengthwise contact with one of the metal contact lines of the first group and with one of the metal contact lines of the second group, the surface region of each of the silicon semiconductor wires in lengthwise contact with the metal contact lines of the first group being of p-type conductivity and the surface region of each of the silicon semiconductor wires in lengthwise contact with the metal contact lines of the second group being of n-type conductivity.

13. The silicon solar cell as claimed in claim 12 in which the silicon semiconductor is of n-type or p-type and the second electrically conductive material is a metal selected from the group consisting of silver, gold, platinum, and an alloy thereof containing a dopant element for silicon semiconductors selected from the group consisting of phosphorus, arsenic, antimony, and bismuth and the first electrically conductive material is a metal selected from the group consisting of silver, gold, platinum, and an alloy thereof containing a dopant for silicon semiconductors selected from the group consisting of boron, aluminum, gallium, and indium.

14. The silicon solar cell as claimed in claim 13 in which the metal contact lines of the first and second groups are formed by a method selected from vacuum vapor deposition, sputtering, ion plating and printing.

15. The silicon solar cell as claimed in claim 12 in which the electrically insulating material for the substrate is glass or a ceramic material.

16. The silicon solar cell as claimed in claim 12 in which each of the silicon semiconductor wires has a cross sectional area in the range from 200 am to 1 $mm^2$.

17. The silicon solar cell as claimed in claim 12 in which each of the silicon semiconductor wires has a resistivity in the range from 0.1 to 100 $\Omega cm$.

18. The silicon solar cell as claimed in claim 12 in which the silicon semiconductor is of n-type and the second electrically conductive material is a metal selected from the group consisting of silver, gold, platinum, and an alloy thereof and the first electrically conductive material is a metal selected from the group consisting of silver, gold, platinum, and an alloy thereof containing a dopant for silicon semiconductors selected from the group consisting of boron, aluminum, gallium, and indium.

19. The silicon solar cell as claimed in claim 12 in which the silicon semiconductor is of p-type and the first electrically conductive material is a metal selected from the group consisting of silver, gold, platinum, and an alloy thereof and the second electrically conductive material is a metal selected from the group consisting of silver, gold, platinum, and an alloy thereof containing a dopant for silicon semiconductors selected from the group consisting of phosphorus, arsenic, antimony, and bismuth.

* * * * *